(12) United States Patent
Umemoto

(10) Patent No.: US 11,979,981 B2
(45) Date of Patent: May 7, 2024

(54) WIRING BOARD

(71) Applicant: KYOCERA Corporation, Kyoto (JP)

(72) Inventor: Takayuki Umemoto, Omihachiman (JP)

(73) Assignee: Kyocera Corporation, Kyoto (JP)

( * ) Notice: Subject to any disclaimer, the term of this patent is extended or adjusted under 35 U.S.C. 154(b) by 79 days.

(21) Appl. No.: 17/911,563

(22) PCT Filed: Feb. 18, 2021

(86) PCT No.: PCT/JP2021/006101
§ 371 (c)(1),
(2) Date: Sep. 14, 2022

(87) PCT Pub. No.: WO2021/186997
PCT Pub. Date: Sep. 23, 2021

(65) Prior Publication Data
US 2023/0104567 A1    Apr. 6, 2023

(30) Foreign Application Priority Data

Mar. 16, 2020 (JP) ................. 2020-045276

(51) Int. Cl.
| | | |
|---|---|---|
| *H05K 1/02* | (2006.01) | |
| *H05K 1/03* | (2006.01) | |
| H05K 3/02 | (2006.01) | |
| H05K 3/10 | (2006.01) | |

(52) U.S. Cl.
CPC ......... *H05K 1/0296* (2013.01); *H05K 1/0373* (2013.01); *H05K 3/02* (2013.01); *H05K 3/108* (2013.01); *H05K 2201/0141* (2013.01); *H05K 2201/0154* (2013.01); *H05K 2201/0209* (2013.01); *H05K 2201/0269* (2013.01); *H05K 2201/0769* (2013.01); *H05K 2203/068* (2013.01)

(58) Field of Classification Search
CPC ......................... H05K 1/0296; H05K 1/0373
See application file for complete search history.

(56) References Cited

U.S. PATENT DOCUMENTS

| | | |
|---|---|---|
| 2008/0254313 A1 | 10/2008 | Kennedy et al. |
| 2010/0201459 A1 | 8/2010 | Kawaguchi et al. |
| 2012/0301825 A1 | 11/2012 | Yoshida et al. |

FOREIGN PATENT DOCUMENTS

| | | |
|---|---|---|
| CN | 101683005 A | 3/2010 |
| JP | 2011-164306 A | 8/2011 |
| TW | 200922391 A | 5/2009 |

*Primary Examiner* — Jeremy C Norris
(74) *Attorney, Agent, or Firm* — Volpe Koenig

(57) ABSTRACT

The wiring board according to the present disclosure includes: a first insulating layer including insulating particles; a plurality of first conductors located on the first insulating layer at an interval of a first distance from each other; a second conductor located on the first insulating layer at an interval of a second distance from the first conductor; and a second insulating layer located on the first insulating layer to cover the first conductor and the second conductors and including the insulating particles. When a boundary portion between the first insulating layer and the second insulating layer is viewed in cross-section in the thickness direction, the ratio of a first area occupied by the insulating particles in a first boundary portion including the first distance is higher than the ratio of a second area occupied by the insulating particles in a second boundary portion including the second distance.

7 Claims, 1 Drawing Sheet

WIRING BOARD

TECHNICAL FIELD

The present invention relates to a wiring board.

BACKGROUND ART

In the wiring board as described in Patent Document 1, fine and high-density wiring is formed, and the pitch of the wiring becomes narrow. In the wiring board having such fine and high-density wiring, ions contained in the resin (the resin forming the insulating layer) existing between the fine wirings (for example, signal conductor layers) may move from the void formed between the molecular chains constituting the resin to the void. For example, when the adjacent fine wirings are an anode and a cathode, ions (metal ions such as copper ions) generated in the fine wiring as the anode move to the fine wiring as the cathode and receive electrons at the cathode, and then a metal such as copper is deposited on the cathode. Therefore, the insulating property between the fine wirings cannot be maintained.

CITATION LIST

Patent Literature

Patent Document 1: JP 2011-164306 A

SUMMARY OF INVENTION

Technical Problem

The object of the present invention is to provide a wiring board having excellent insulation reliability even with fine and high-density wiring.

Solution to Problem

The wiring board according to the present disclosure includes: a first insulating layer including insulating particles; a plurality of first conductors located on the first insulating layer at an interval of a first distance from each other; a second conductor located on the first insulating layer at an interval of a second distance from the first conductors; and a second insulating layer located on the first insulating layer to cover the first conductor and the second conductors and including the insulating particles. The first distance is shorter than the second distance. When a boundary portion between the first insulating layer and the second insulating layer is viewed in cross-section in the thickness direction, the ratio of a first area occupied by the insulating particles in a first boundary portion including the first distance is higher than the ratio of a second area occupied by the insulating particles in a second boundary portion including the second distance.

Advantageous Effects of Invention

In the wiring board according to the present disclosure, when a boundary portion between the first insulating layer and the second insulating layer is viewed in cross-section in the thickness direction, the ratio of a first area occupied by the insulating particles in a first boundary portion including the first distance is higher than the ratio of a second area occupied by the insulating particles in a second boundary portion including the second distance. More insulating particles are included between the first conductors where the interval between each other is narrow and ions are more likely to move, so that the movement of ions is more easily prevented. As a result, the wiring board according to the present disclosure has excellent insulation reliability even with fine and high-density wiring.

DESCRIPTION OF EMBODIMENTS

Figure 1:
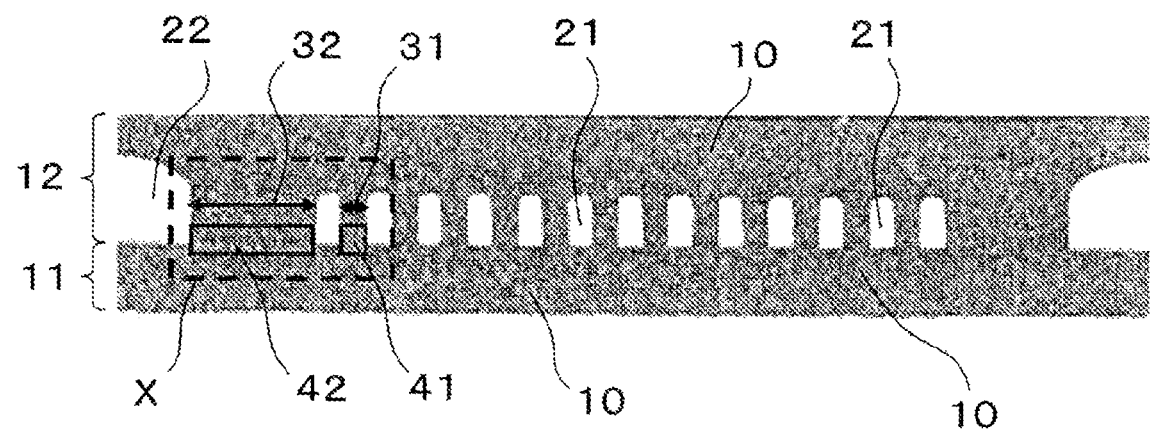
FIG. 1 is an electron microscope photograph illustrating a cross-section of a main part of a wiring board according to one embodiment of the present disclosure.

A wiring board according to one embodiment of the present disclosure will be described with reference to FIGS. 1 and 2. FIG. 1 is an electron microscope photograph illustrating a cross-section of a main part of a wiring board according to one embodiment of the present disclosure. As illustrated in FIG. 1, the wiring board according to one embodiment includes a first insulating layer 11 including insulating particles 10, a second insulating layer 12 including insulating particles 10, first conductors 21, and a second conductor 22.

The first insulating layer 11 and the second insulating layer 12 are not particularly limited as long as they are formed of a material having an insulating property. Examples of the material having the insulating property include resins such as epoxy resin, bismaleimide-triazine resin, polyimide resin, polyphenylene ether resin, and liquid crystal polymer. These resins may be used in single kind or in combination of two or more kinds. The first insulating layer 11 and the second insulating layer 12 may be the same material (resin) or different materials (resin).

The thicknesses of the first insulating layer 11 and the second insulating layer 12 are not particularly limited, and is, for example, from 2 µm to 30 µm. The first insulating layer 11 and the second insulating layer 12 may have the same thickness or may have different thicknesses. The second insulating layer 12 is located on the first insulating layer 11 and covers the first conductors 21 and the second conductor 22 described later.

The first insulating layer 11 and the second insulating layer 12 include the insulating particles 10. The insulating particles 10 are dispersed in a resin material having an insulating property, and have a function of reducing the thermal expansion coefficient of the insulating layer. Examples of the insulating particles 10 include inorganic insulating fillers such as silica, alumina, barium sulfate, talc, clay, glass, calcium carbonate, and titanium oxide. The insulating particles 10 included in the first insulating layer 11 and included in the second insulating layer 12 may be the same inorganic insulating filler or different inorganic insulating fillers. The insulating particles 10 may be used in a single kind or in combination of two or more kinds.

The particle size of the insulating particle 10 is not limited, and is, for example, 5 µm or less. The insulating particles 10, when having such a relatively small particle size, are more easily dispersed through the first distance 31 that is a narrow interval. As a result, more insulating particles 10 exist between the first conductors 21 where ions are more likely to move, and the movement of ions is more easily prevented. The average particle diameter of the insulating particles 10 is preferably about from 0.3 µm to 3 µm.

Thus, when the particle diameter of the insulating particles 10 is set in a specific range, it is advantageous in that the insulating layer can be highly filled with the insulating particles 10.

The first conductors 21 and the second conductor 22 are located on the first insulating layer 11 including the insulating particles 10. The first conductor 21 and the second conductor 22 are formed of, for example, a metal such as copper, more specifically, a metal foil such as copper foil or a metal plating such as copper plating. The first conductor 21 and the second conductor 22 may be, for example, the same metal or different metals. Each of the first conductor 21 and the second conductor 22 include a signal conductor, a grounding conductor, a power supply conductor, or the like.

The thicknesses of the first conductor 21 and the second conductor 22 are not particularly limited, and are each, for example, from 2 µm to 10 µm. The first conductor 21 and the second conductor 22 may have the same thickness or different thicknesses. For example, when the first conductor 21 is a signal conductor, and the second conductor 22 is a grounding conductor or a power supply conductor, the second conductor 22 serving as the charge supply path may be larger than the thickness of the first conductor 21 in that the larger the thickness, the smaller the resistance value, and more specifically, the thickness is preferably about from 0.1 µm to 4 µm.

As illustrated in FIG. 1, the plurality of first conductors 21 are located at intervals of the first distance 31 from each other. The first distance 31 refers to the distance between the sidewalls of the first conductors 21 adjacent to each other. Although the first distance 31 is not limited, the effect of preventing the movement of ions is remarkably exhibited when the first distance 31 is short. The first distance 31 may be, for example, 3 µm or less. In the wiring board according to one embodiment, the first conductor 21 may be, for example, a signal conductor.

On the other hand, the second conductor 22 is located at an interval of a second distance 32 from the first conductor 21 located closest to the second conductor 22. The second distance 32 is not limited as long as it is wider than the first distance 31. When three or more first conductors 21 are arranged side by side, and a plurality of first distances 31 are arranged, the average value thereof is wider than the second distance 32. The second distance 32 is, for example, from 4 µm to 100 µm. In the wiring board according to one embodiment, the second conductor 22 may be, for example, a grounding conductor or a power supply conductor.

Figure 2:
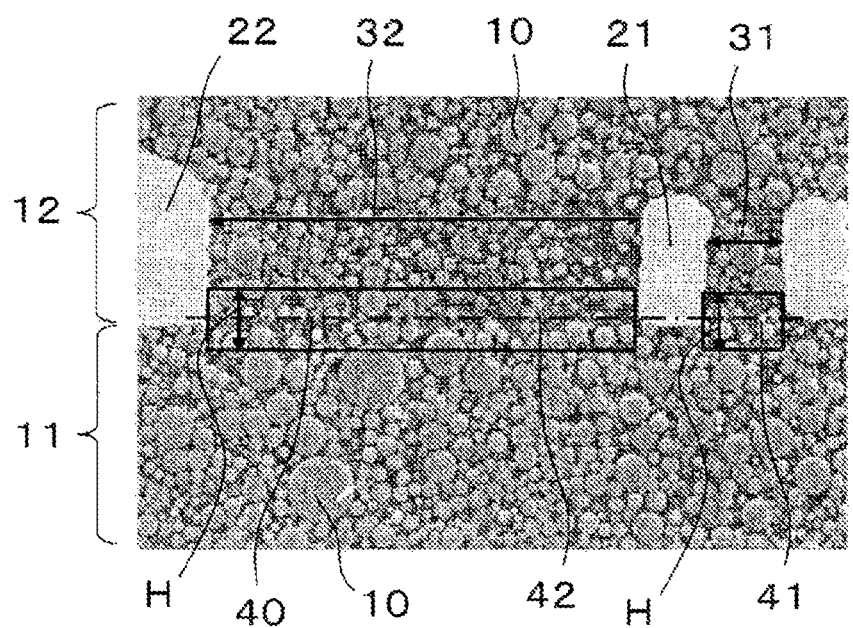
FIG. 2 is an enlarged explanatory view for illustrating a region X in FIG. 1.

In the wiring board according to one embodiment, in a boundary portion 40 between the first insulating layer 11 and the second insulating layer 12, the density of the insulating particles 10 dispersed in the first insulating layer 11 and the second insulating layer 12 is higher in a first boundary portion 41 including the first distance 31 than in a second boundary portion 42 including the second distance 32, as illustrated in FIG. 2. That is, as illustrated in FIG. 2, when the boundary portion 40 between the first insulating layer 11 and the second insulating layer 12 is viewed in cross-section, the ratio of the first area occupied by the insulating particles 10 in the first boundary portion 41 including the first distance 31 is higher than the ratio of the second area occupied by the insulating particles 10 in the second boundary portion 42 including the second distance 32. When three or more first conductors 21 are located side by side as illustrated in FIG. 1, the average value of the ratio of the first area in the plurality of first boundary portions 41 is higher than the ratio of the second area in the second boundary portion 42. For example, (the average value of) the ratio of the first area is about 10% higher than the ratio of the second area.

The boundary portion 40 between the first insulating layer 11 and the second insulating layer 12 refers to a virtual line connecting the lower portions of the plurality of the first conductors 21 and the second conductor 22, in the thickness direction of the first insulating layer 11 and the second insulating layer 12 and in the cross-section where the plurality of the first conductors 21 and the second conductor 22 are arranged side by side. FIG. 2 illustrates the above-described cross-section of the wiring board observed with an electron microscope at a magnification of 5000. In the measurement of the ratio of the first area and the ratio of the second area, it is necessary that the observed image data by the electron microscope is displayed by distinguishing the resin having the insulating property and the insulating particles 10 with a predetermined brightness as a reference value, and the ratio of the area occupied by the insulating particles 10 to the areas of the first boundary portion 41 and to the second boundary portion 42 are respectively calculated.

As illustrated in FIG. 2, the first boundary portion 41 means a region surrounded by a range extending 0.75 µm (H illustrated in FIG. 2) above and below the boundary portion 40 between the first insulating layer 11 and the second insulating layer 12, and the first distance 31. Further, as illustrated in FIG. 2, the second boundary portion 42 means a region surrounded by the second distance 32 in a range of 0.75 µm (H illustrated in FIG. 2) above and below the boundary portion 40 between the first insulating layer 11 and the second insulating layer 12. In the present example, for example, the first distance 31 is 3 µm, and the second distance 32 is 15 µm.

When the boundary portion 40 between the first insulating layer 11 and the second insulating layer 12 is viewed in cross-section in the thickness direction, the ratio of the first area occupied by the insulating particles 10 in the first boundary portion 41 is not limited as long as it is higher than the ratio of the second area occupied by the insulating particles 10 in the second boundary portion 42. The ratio of the first area occupied by the insulating particles 10 in the first boundary portion 41 may be, for example, 60% or more, and more preferable from 62% to 71%.

When the ratio of the first area occupied by the insulating particles 10 in the first boundary portion 41 is 60% or more, the insulating particles 10 are sufficiently distributed in the first boundary portion 41. Thus, even between the first conductors 21 located at the relatively narrow first distance 31, the movement of ions is more easily prevented. That is, the ions cannot move linearly between the first conductors 21 due to the insulating particles 10, and must bypass the insulating particles 10. This makes it difficult for ions to move between the first conductors 21 and improves insulation reliability. For example, when the first distance 31 is 3 µm, the average particle diameter of the insulating particle 10 is 0.5 µm, and the thickness of the second insulating layer 12 is 15 µm, it is easy to apply a configuration in which the ratio of the first area occupied by the insulating particles 10 is 60% or more.

The difference between the ratios of the first area and of the second area are not limited. For example, the ratio of the first area may be at least 5% higher than the ratio of the second area, or may be 5.5% to 22.5% higher.

In the first insulating layer 11 and the second insulating layer 12, the density of the insulating particles 10 present in the portions other than the first distance 31, the second distance 32, the first boundary portion 41, and the second boundary portion 42 is not limited. For example, when the first insulating layer 11 and the second insulating layer 12 are viewed in cross-section in the thickness direction, the ratio of a third area occupied by the insulating particles 10 present in the portions other than the first distance 31, the second distance 32, the first boundary portion 41, and the second boundary portion 42 in the first insulating layer 11 and the second insulating layer 12 may be higher than the ratio of the first area. In this case, it is advantageous in that the insulating particles 10 contained in the first insulating layer 11 and the second insulating layer 12 can be sufficiently supplied to the first boundary portion 41, and the insulating particles 10 can be arranged at high density in the first boundary portion 41. When it is desired to reduce the thermal expansion coefficient of the insulating layer, the first insulating layer 11 and the second insulating layer 12 are highly filled with the insulating particles 10. From the viewpoint of the adhesion strength in the boundary portion between the first insulating layer 11 and the second insulating layer 12, the ratio of the first area occupied by the insulating particles 10 may be smaller than that of the third area in order to secure the contact region between resins having excellent adhesion.

When the boundary portion 40 between the first insulating layer 11 and the second insulating layer 12 is viewed in cross-section in the thickness direction, the method of making the ratio of the first area occupied by the insulating particles 10 in the first boundary portion 41 higher than the ratio of the second area occupied by the insulating particles 10 in the second boundary portion 42 is not particularly limited. To obtain a wiring board having such a structure, for example, a two-stage vacuum laminator is used.

Specifically, the first insulating layer 11 including the insulating particles 10 is prepared. In the wiring board, for example, when the first insulating layer 11 corresponds to the core insulating layer, the first insulating layer 11 including the insulating particles 10 is obtained from an insulating plate such as a double-sided copper-clad laminate. By the subtractive method, as illustrated in FIG. 1, on the surface of an insulating plate such as a double-sided copper-clad laminate, the first conductors 21 are formed at intervals of the first distance 31, and the second conductor 22 is formed at an interval of the second distance 32. Although not illustrated, such an insulating plate may have through-holes formed, for example, by drilling, blasting, or a laser machining process. A through-hole conductor is formed in the through-hole.

On the other hand, when the first insulating layer 11 corresponds to an insulating layer other than the core insulating layer, such as an insulating layer for buildup, for example, the first insulating layer 11 including the insulating particles 10 is obtained from an insulating resin film or the like. By the semi-additive method, as illustrated in FIG. 1, on the surface of the insulating resin film, the first conductor 21 is formed at an interval of the first distance 31, and the second conductor 22 is formed at an interval of the second distance 32. Although not illustrated, a via hole may be formed in such an insulating resin film by, for example, a laser machining process. A via hole conductor is formed in the via hole.

The surface of the first insulating layer 11 may be etched, for example. By performing the etching process, a part of the insulating particles 10 is exposed from the surface of the first insulating layer 11.

Next, the second insulating layer 12 including the insulating particles 10 is superposed in a manner to cover the first insulating layer 11 formed with the first conductors 21 and the second conductor 22. Thereafter, by using a two-stage vacuum laminator to apply pressure to the first insulating layer 11 and the second insulating layer 12 from above a diaphragm provided in the laminator, vacuum lamination is performed on the first insulating layer 11 and the second insulating layer 12. At this time, the flowability of the resin forming the second insulating layer 12 is reduced. Thus, the insulating particles 10 rather than the resin is preferentially pushed into the relatively narrow first distance 31. On the other hand, the insulating particles 10 are not preferentially pushed into the relatively wide second distance 32, and the second insulating layer 12 is directly adhered to the first insulating layer 11. For example, when the first distance 31 is 3 µm, the average particle diameter of the insulating particle 10 is 0.5 µm, and the thickness of the second insulating layer 12 is 15 µm, the insulating particles 10 rather than the resin are more likely to be preferentially pushed between the first conductors 21. As a result, the ratio of the first area occupied by the insulating particles 10 is likely to be 60% or more.

Thus, in the boundary portion 40 between the first insulating layer 11 and the second insulating layer 12, the density of the insulating particles 10 dispersed in the first boundary portion 41 including the first distance 31 is higher than that of the insulating particles 10 dispersed in the second boundary portion 42 including the second distance 32.

The wiring board of the present disclosure may have the structure described above at least partially. For example, the structure described above may be a part of the build-up layer formed on the surface of the core insulating layer, and the first insulating layer 11 may correspond to the core insulating layer. Further, although not illustrated, a through-hole conductor, a via hole conductor, or the like may be formed in the first insulating layer 11 and the second insulating layer 12 as required.

REFERENCE SIGNS LIST

10 Insulating particle
11 First insulating layer
12 Second insulating layer
21 First conductor
22 Second conductor
31 First distance
32 Second distance
40 Boundary portion
41 First boundary portion
42 Second boundary portion

The invention claimed is:

1. A wiring board, comprising:
a first insulating layer comprising insulating particles;
a plurality of first conductors located on the first insulating layer at intervals of a first distance from each other;
a second conductor located on the first insulating layer at an interval of a second distance from the first conductor; and
a second insulating layer located on the first insulating layer and covering the plurality of first conductors and the second conductor, the second insulating layer comprising the insulating particles,
wherein
the first distance is shorter than the second distance, and
in a thickness direction of the first insulating layer and the second insulating layer, and in a cross-section where the plurality of first conductors and the second conductor are arranged side by side, a ratio of a first area occupied by the insulating particles in a first boundary portion comprising the first distance is higher than a ratio of a second area occupied by the insulating particles in a second boundary portion comprising the second distance.

2. The wiring board according to claim 1, wherein the first distance is 3 μm or less.

3. The wiring board according to claim 1, wherein the ratio of the first area is 60% or more.

4. The wiring board according to claim 1, wherein in the cross-section, of the first insulating layer and the second insulating layer, a ratio of a third area occupied by the insulating particles in a portion other than between the plurality of first conductors and between the first conductor and the second conductor is higher than the ratio of the first area.

5. The wiring board according to claim 1, wherein the insulating particles have a particle size of 0.5 μm or less, and the second insulating layer has a thickness of 15 μm or less.

6. The wiring board according to claim 1, wherein the second conductor is thicker than each of the first conductors.

7. The wiring board according to claim 1, wherein the first conductor is a signal conductor, and the second conductor is a grounding conductor or a power supply conductor.

* * * * *